United States Patent
Hung et al.

(10) Patent No.: US 10,271,401 B1
(45) Date of Patent: Apr. 23, 2019

(54) ELECTRONIC DEVICE

(71) Applicant: ASIAN POWER DEVICES INC., Taoyuan (TW)

(72) Inventors: Tsung-Liang Hung, Taoyuan (TW); Yeu-Torng Yau, Taoyuan (TW)

(73) Assignee: ASIAN POWER DEVICES INC., Taoyuan (TW)

( * ) Notice: Subject to any disclaimer, the term of this patent is extended or adjusted under 35 U.S.C. 154(b) by 0 days.

(21) Appl. No.: 16/025,948

(22) Filed: Jul. 2, 2018

(30) Foreign Application Priority Data

Apr. 19, 2018 (TW) .............................. 107113399 A

(51) Int. Cl.
| H05B 37/02 | (2006.01) |
| H05B 33/08 | (2006.01) |
| H05K 1/11 | (2006.01) |
| H02H 7/20 | (2006.01) |
| H05K 1/18 | (2006.01) |

(52) U.S. Cl.
CPC ........... *H05B 33/0887* (2013.01); *H02H 7/20* (2013.01); *H05K 1/111* (2013.01); *H05K 1/181* (2013.01); *H05K 2201/10022* (2013.01); *H05K 2201/10106* (2013.01)

(58) Field of Classification Search
CPC ............ H05B 33/0848; H05B 33/0854; H05B 37/0227; H05B 37/0254; H05B 37/03
USPC ........................................................ 315/309
See application file for complete search history.

(56) References Cited

U.S. PATENT DOCUMENTS

| 4,750,332 A * | 6/1988 | Jenski ..................... F25D 29/00 62/155 |
| 2007/0166148 A1* | 7/2007 | Middleton .............. F04D 29/38 415/118 |
| 2011/0163696 A1* | 7/2011 | Huang ................ H05B 33/0845 315/309 |
| 2014/0001952 A1* | 1/2014 | Harris ................ H05B 37/0272 315/51 |
| 2016/0044760 A1* | 2/2016 | Robert ............... H05B 33/0851 315/151 |
| 2016/0219664 A1* | 7/2016 | Ellenberger ....... H05B 33/0842 |
| 2017/0359876 A1* | 12/2017 | Zhang .................. H05B 33/089 |
| 2018/0242421 A1* | 8/2018 | Ohta ................... H05B 33/0854 |

* cited by examiner

*Primary Examiner* — Tung X Le
(74) *Attorney, Agent, or Firm* — Cheng-Ju Chiang

(57) ABSTRACT

An electronic device is provided. The electronic device integrates an enable function and an over-temperature protection function (OTP) on the same line, thereby reducing the PCB layout between a microcontroller and a mainboard circuit, and further reducing the circuit complexity and cost. In addition, the negative temperature coefficient (NTC) thermistor in the electronic device is also directly coupled to a circuit pin used for the enable function of the microcontroller to serve as an over-temperature protection application. Therefore, even if the microcontroller fails, the electronic device may still use the hardware circuit structure to automatically achieve the over-temperature protection function.

7 Claims, 2 Drawing Sheets

ELECTRONIC DEVICE

FIELD OF THE INVENTION

The present invention relates to an electronic device and more particularly to an electronic device capable of reducing the layout between a microcontroller (MCU) and a mainboard circuit disposed inside.

BACKGROUND OF THE INVENTION

In general, when a microcontroller is used to enable and protect certain types of electronic devices from over-temperature, a circuit pin on the microcontroller is coupled to a mainboard circuit of the electronic device for outputting an enable signal. Another circuit pin on the microcontroller is coupled to a thermistor for detecting an operating temperature of the electronic device. It can be known from the above content that in the conventional implementation, the microcontroller needs at least two physical lines to connect to the mainboard circuit and the thermistor, but this often results in difficulty in layout on a printed circuit board (PCB) for miniaturized design, and if the microcontroller fails, it will lose the function of over-temperature protection. Therefore, how to effectively reduce the PCB layout between the microcontroller and the mainboard circuit and maintain the original over-temperature protection function is indeed an issue that urgently needs to be solved in the field.

SUMMARY OF THE INVENTION

An embodiment of the present invention provides an electronic device. The electronic device comprises a mainboard circuit, a thermistor and a microcontroller. The mainboard circuit comprises an input terminal and a ground terminal, and the thermistor is serially connected between the input terminal and the ground terminal. The microcontroller comprises a first circuit pin and a second circuit pin. The first circuit pin is coupled to the input terminal of the mainboard circuit via a connection and is used to detect a temperature relating to the mainboard circuit via the thermistor. The second circuit pin is coupled to a node on the connection via a resistor, and is used to output an enable signal to the mainboard circuit so that the mainboard circuit may determine to be in a standby mode or an operation mode according to the enable signal.

An embodiment of the present invention further provides an electronic device. The electronic device comprises a mainboard circuit, a thermistor and a microcontroller. The mainboard circuit comprises an input terminal and a ground terminal, and the thermistor is serially connected between the input terminal and the ground terminal. The microcontroller comprises a single circuit pin. The circuit pin is coupled to the input terminal of the mainboard circuit via a connection, and is used to detect a temperature relating to the mainboard circuit via the thermistor and to output an enable signal to the mainboard circuit so that the mainboard circuit can decide to be in a standby mode or an operation mode according to the enable signal.

The structural features and the technical means adopted by the present invention to achieve the above and other objects can be best understood by referring to the following detailed description of the preferred embodiments and the accompanying drawings. However, the detailed description and the accompanying drawings are only used to explain and illustrate the present invention rather than as limitative of the appended claims of the present invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1:
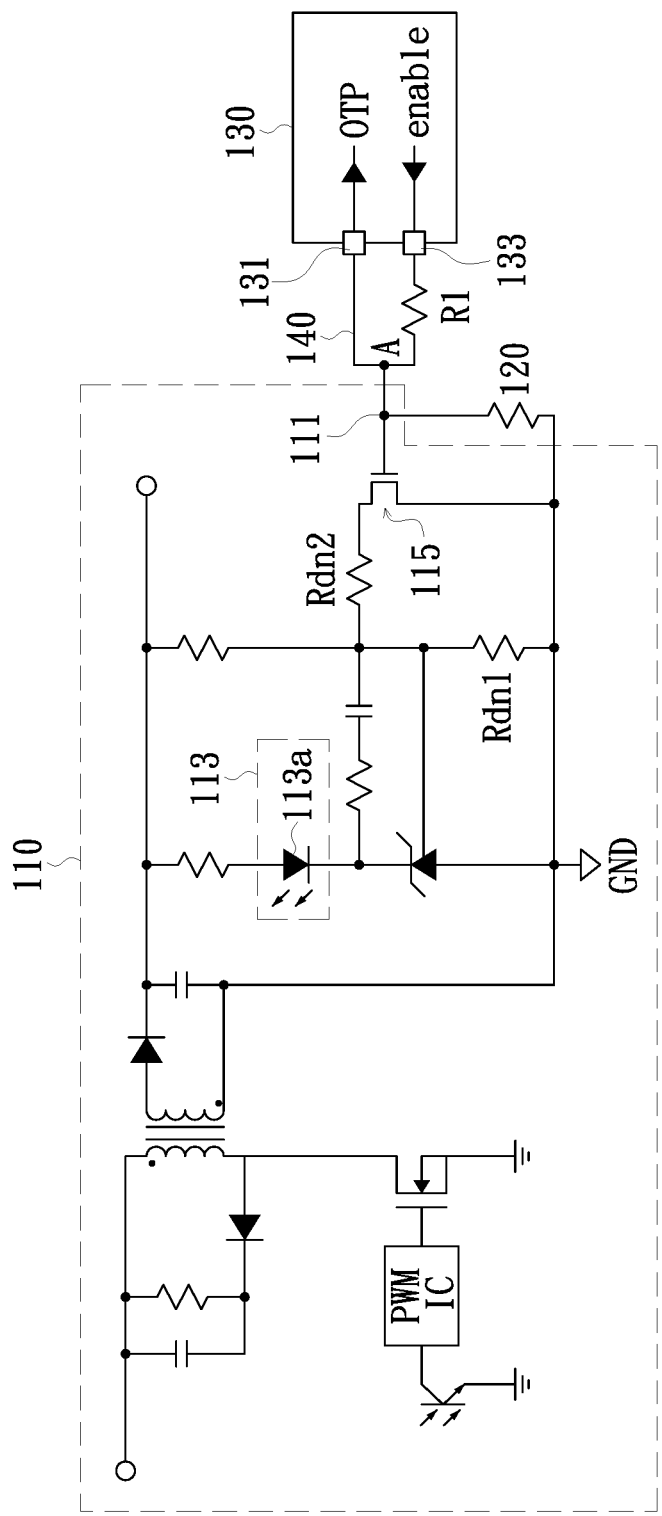
FIG. 1 is a schematic circuit diagram of an electronic device according to an embodiment of the present invention.

Hereinafter, the present invention will be described in detail with drawings illustrating various embodiments of the present invention. However, the concept of the present invention may be embodied in many different forms and should not be construed as limitative of the exemplary embodiments set forth herein. In addition, the same reference numbers may be used to indicate similar elements in the drawings.

Firstly, please refer to FIG. 1; FIG. 1 is a schematic circuit diagram of an electronic device according to an embodiment of the present invention. An electronic device 1 mainly comprises a mainboard circuit 110, a thermistor 120, and a microcontroller 130. Wherein, the mainboard circuit 110 comprises an input terminal 111 and a ground terminal GND, and the thermistor 120 is connected in series between the input terminal 111 and the ground terminal GND of the mainboard circuit 110. In this embodiment, the mainboard circuit 110 can be, for example, a light-emitting diode (LED) driving circuit, but the present invention is not limited thereto. In summary, the present invention does not limit the specific implementation of the mainboard circuit 110. Those ordinarily skilled in the art should be able to make related designs based on actual needs or applications. In addition, in some embodiments, the mainboard circuit 110, the thermistor 120 and the microcontroller 130 can also be, for example, integrated on the same PCB, but the present invention is not limited thereto.

The microcontroller 130 comprises a circuit pin 131 and a circuit pin 133. The circuit pin 131 is coupled to the input terminal 111 of the mainboard circuit 110 via a connection 140, and is used to detect a temperature relating to the mainboard circuit 110 via the thermistor 120. The circuit pin 133 is coupled to a node A on the connection 140 via a resistor R1, and is used to output an enable signal (not shown in the FIG.) to the mainboard circuit 110 so that the mainboard circuit 110 may determine to be in a standby mode or an operation mode according to the enable signal. It can be known from the above content that one of the main concepts of the embodiment of the present invention is to integrate an enable function and an over-temperature protection (OTP) function on the same line, thereby reducing the PCB layout between the microcontroller 130 and the mainboard circuit 110. In other words, the physical circuit between the microcontroller 130 and the mainboard circuit 110 is reduced, and thus the PCB layout space is saved, and the circuit complexity and cost are reduced.

Further, the mainboard circuit 110 can further comprise a working circuit 113 and a switching circuit 115. In this embodiment, because the mainboard circuit 110 is a LED driving circuit, the working circuit 113 of FIG. 1 may be referred to including at least one light-emitting diode component 113*a*, but the present invention is not limited thereto. In addition, the switching circuit 115 has a first terminal and a second terminal respectively coupled to the working circuit 113 and the ground terminal GND, and a third terminal coupled to the input terminal 111 and controlled by the enable signal to enable or disable a conduction between the first terminal and the second terminal. It should be explained that the present invention does not limit the specific implementation of the switching circuit 115. In practice, as long as a switch that can enable or disable the conduction between the first terminal and the second terminal, it can be used as the switching circuit 115 of this embodiment.

Therefore, when the mainboard circuit 110 is in the standby mode, the circuit pin 133 of the microcontroller 130 will send a low-level enable signal to cut off the switching circuit 115 so that a resistor Rdn2 in the mainboard circuit 110 is turned off, resulting in a reduction of the flyback voltage output in the mainboard circuit 110. On the contrary, when the mainboard circuit 110 is in the operation mode, the circuit pin 133 of the microcontroller 130 will send a high-level enable signal to conduct the switching circuit 115 so that the resistor Rdn2 in the mainboard circuit 110 is incorporated into a resistor Rdn1, resulting in an increase of the flyback voltage output. Thereby, the light-emitting diode component 113*a* is driven to emit light. However, since the standby/operation principle of the LED driving circuit is well known to those having ordinary knowledge in the art, detailed content of the above-mentioned mainboard circuit 110 will not be further described herein.

In addition, the present invention does not limit the specific implementation of the microcontroller 130 to detect the temperature relating to the mainboard circuit 110 via the thermistor 120, and the over-temperature protection of the mainboard circuit 110. Those ordinary skilled in the art should be able to make related designs based on actual needs or applications. In this embodiment, the thermistor 120 can be, for example, a negative temperature coefficient (NTC) thermistor, and the thermistor 120 is connected in series between the input terminal 111 and the ground terminal GND of the mainboard circuit 110. Therefore, when the higher the temperature and the lower the resistance value of the thermistor 120; in this embodiment, the switching circuit 115 may be pulled down directly so that the mainboard circuit 110 enters the over-temperature protection state. In other words, when the temperature becomes higher and the resistance value of the thermistor 120 becomes lower, the mainboard circuit 110 enters the over-temperature protection state via the thermistor 120. As a result, as shown in FIG. 1, since the thermistor 120 is also directly coupled to the circuit pin 133, even if the microcontroller 130 fails, the hardware circuit structure of this embodiment may still be used to automatically achieve the over-temperature protection function.

On the other hand, in other embodiments, the same circuit that integrates the enable function and the over-temperature protection function may also be designed as being disposed within the microcontroller 130. Therefore, please refer to FIG. 2, which is a schematic circuit diagram of an electronic device according to another embodiment of the present invention. Wherein, parts of elements of FIG. 2 that are the same as those of FIG. 1 are indicated by the same figure numbers, and thus details thereof will not be described herein.

Figure 2:
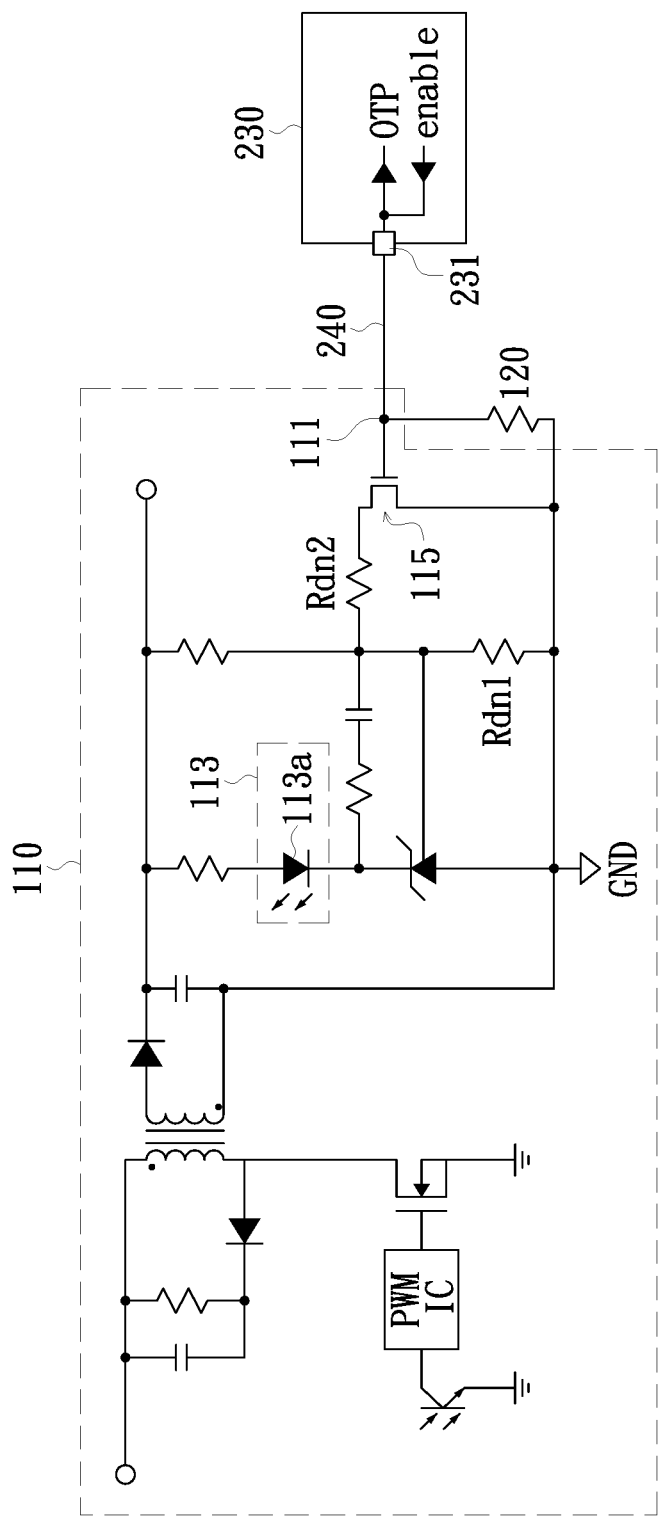
FIG. 2 is a schematic circuit diagram of the electronic device according to another embodiment of the present invention.

In comparison with the electronic device 1 of FIG. 1, a microcontroller 230 of an electronic device 2 of FIG. 2 comprises a circuit pin 231. The circuit pin 231 is coupled to the input terminal 111 of the mainboard circuit 110 via a connection 240, and is used to detect a temperature relating to the mainboard circuit 110 via the thermistor 120 and to output an enable signal to the mainboard circuit 110 so that the mainboard circuit 110 may determine to be in a standby mode or an operation mode according to the enable signal. In other words, the microcontroller 230 of FIG. 2 employs the single circuit pin 231 as a means for enabling and protecting the mainboard circuit 110 from over-temperature at the same time. Therefore, it should be understood that the microcontroller 230 may further comprise two internal lines that are commonly coupled to the circuit pin 231. One of the internal lines is used to receive a resistance value of the thermistor 120, and the other internal line is used to output the enable signal.

It should be explained that the present invention does not limit the specific implementation of the two internal lines commonly coupled to the circuit pin 231, and those ordinarily skilled in the art should be able to make related designs based on actual needs or applications. In other words, the common coupling mode adopted in FIG. 2 is only an example here, and it is not intended to limit the present invention. In addition, in this embodiment, the microcontroller 230 may also be selectively connected in series with the resistor R1 via the internal line for transmitting the enable signal, so as to enhance the relieving of the impedance effect between the two internal lines, but the present invention is also not limited thereto. Additionally, detailed descriptions of the mainboard circuit 110 and the thermistor 120 of FIG. 2 are also the same as described in the aforementioned embodiment, and thus details thereof will not be described herein.

In summary, the electronic device provided by the embodiments of the present invention integrates the enable function and the over-temperature protection function on the same line, thereby reducing the PCB layout between the microcontroller and the mainboard circuit, and further reducing the circuit complexity and cost. In addition, the NTC thermistor in the electronic device is also directly coupled to the circuit pin used for the enable function by the microcontroller, and is serially connected between the input terminal and the ground terminal of the mainboard circuit to serve as an over-temperature protection application. Therefore, even if the microcontroller fails, the embodiments of the present invention can still use the hardware circuit structure to automatically achieve the over-temperature protection function.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:
1. An electronic device, comprising:
 a mainboard circuit comprising an input terminal and a ground terminal;
 a thermistor serially connected between the input terminal and the ground terminal of the mainboard circuit; and
 a microcontroller, comprising:

a first circuit pin coupled to the input terminal of the mainboard circuit via a connection and used to detect a temperature relating to the mainboard circuit via the thermistor; and a second circuit pin coupled to a node on the connection via a resistor and used to output an enable signal to the mainboard circuit for the mainboard circuit to determine to be in a standby mode or an operation mode according to the enable signal;

wherein the mainboard circuit further comprises:

a working circuit; and a switching circuit having a first terminal and a second terminal respectively coupled to the working circuit and the ground terminal, and a third terminal coupled to the input terminal and controlled by the enable signal to enable or disable a conduction between the first terminal and the second terminal.

2. The electronic device according to claim 1, wherein the thermistor is a negative temperature coefficient (NTC) thermistor, and when the temperature is increased, the resistance value of the thermistor will be decreased, and the mainboard circuit enters an over-temperature protection state via the thermistor.

3. The electronic device according to claim 2, wherein the mainboard circuit is a light-emitting diode (LED) driving circuit, and the working circuit includes at least one light-emitting diode component.

4. An electronic device, comprising:

a mainboard circuit comprising an input terminal and a ground terminal;

a thermistor serially connected between the input terminal and the ground terminal of the mainboard circuit; and a microcontroller, comprising:

a circuit pin coupled to the input terminal of the mainboard circuit via a connection and used to detect a temperature relating to the mainboard circuit via the thermistor, and used to output an enable signal to the mainboard circuit for the mainboard circuit to determine to be in a standby mode or an operation mode according to the enable signal;

wherein the mainboard circuit further comprises:

a working circuit; and a switching circuit having a first terminal and a second terminal respectively coupled to the working circuit and the ground terminal, and a third terminal coupled to the input terminal and controlled by the enable signal to enable or disable a conduction between the first terminal and the second terminal.

5. The electronic device according to claim 4, wherein the thermistor is a negative temperature coefficient (NTC) thermistor, and when the temperature is increased, the resistance value of the thermistor will be reduced, and the mainboard circuit enters an over-temperature protection state via the thermistor.

6. The electronic device according to claim 5, wherein the mainboard circuit is a light-emitting diode (LED) driving circuit, and the working circuit includes at least one light-emitting diode component.

7. The electronic device according to claim 6, wherein the microcontroller further comprises a first internal line and a second internal line commonly coupled to the circuit pin, the first internal line is used to receive the resistance value of the thermistor, and the second internal line is used to output the enable signal.

\* \* \* \* \*